United States Patent [19]

Kusumi

[11] Patent Number: 5,627,408
[45] Date of Patent: May 6, 1997

[54] WIRE BONDING STRUCTURE FOR SEMICONDUCTOR DEVICES

[75] Inventor: Megumi Kusumi, Yokohama, Japan

[73] Assignee: Kabushiki Kaisha Toshiba, Kawasaki, Japan

[21] Appl. No.: 444,039

[22] Filed: May 18, 1995

[30] Foreign Application Priority Data

May 19, 1994 [JP] Japan ................................. 6-129640

[51] Int. Cl.⁶ .................... H01L 23/053; H01L 23/06; H01L 23/48
[52] U.S. Cl. .................. 257/784; 257/700; 257/705; 257/734; 257/697
[58] Field of Search ................... 257/666, 676, 257/678, 700, 701, 703, 705, 734, 784, 797, 697

[56] References Cited

U.S. PATENT DOCUMENTS

| | | | |
|---|---|---|---|
| 4,924,297 | 5/1990 | Denda | 257/797 |
| 5,008,734 | 4/1991 | Dutta et al. | 257/705 |
| 5,245,214 | 9/1993 | Simpson | 257/666 |

Primary Examiner—Carl Whitehead, Jr.
Attorney, Agent, or Firm—Finnegan, Henderson, Farabow, Garrett & Dunner, L.L.P.

[57] ABSTRACT

A semiconductor substrate is positioned in a cavity formed at the center of the major surface of a mounting portion. A plurality of inner leads comprising signal leads and power supply leads are arranged along the peripheral area of the major surface of the mounting portion, with their ends opposed to the semiconductor substrate. The inner leads are connected to the semiconductor substrate by way of bonding wires. All of the bonding wires connecting the signal leads to the semiconductor substrate have substantially the same length. The inner leads are formed on the surfaces of the ceramic layers that are partially laid one on the other to form a multilayer structure. The ceramic layer supports the signal leads and has a polygonal opening or cavity, the number of the corners of which is greater than that of the mounting portion. The ceramic layer may have a stepped profile in which a surface portion of the ceramic layer which is close to the corners of the mounting portion is high and a surface portion of the ceramic layer which is close to the middle portion of the edges of the mounting portion is low. With the above structure, variation in length of the bonding wires connecting the signal leads to the corresponding bonding pads on the semiconductor substrate can be reduced.

6 Claims, 8 Drawing Sheets

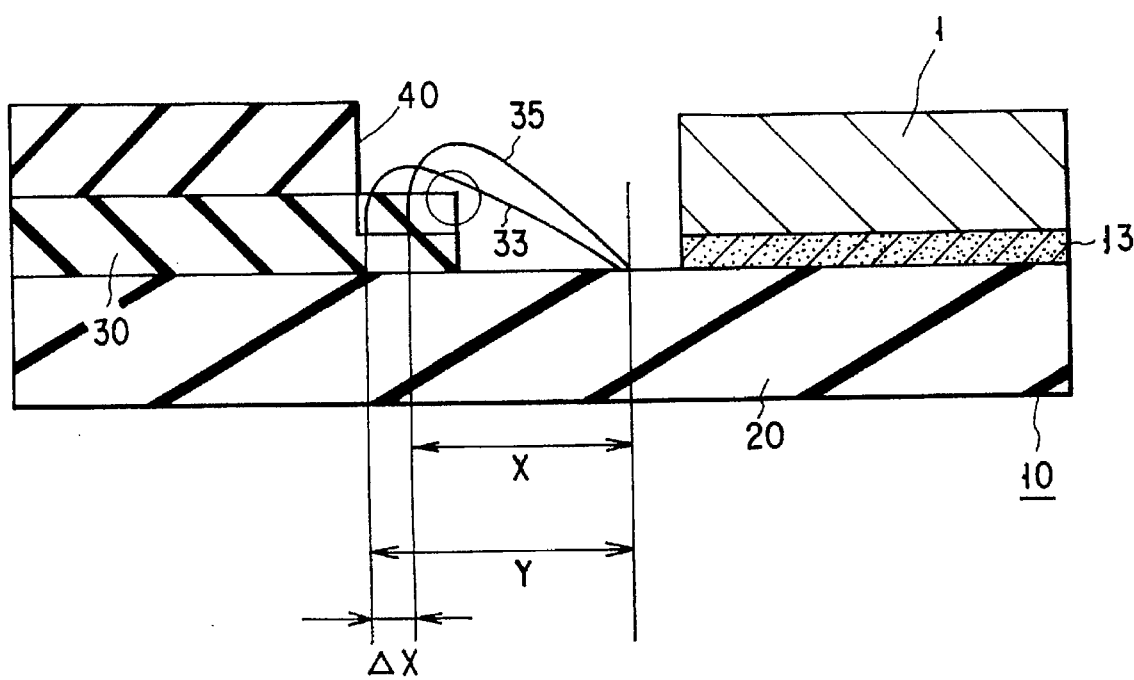
F I G. 11
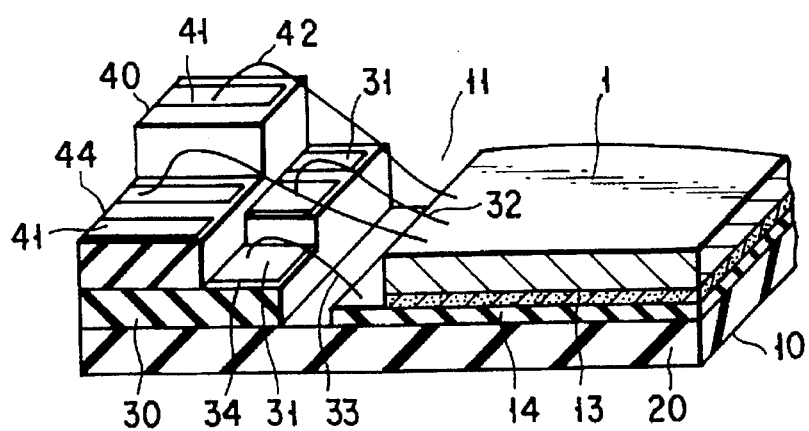
F I G. 12

WIRE BONDING STRUCTURE FOR SEMICONDUCTOR DEVICES

BACKGROUND OF THE INVENTION

1. Field of the Invention

This invention relates to a semiconductor device that operates excellently in a high frequency range typically between 300 MHz and 1 GHz.

2. Description of the Related Art

A semiconductor device comprising an IC on a large scale is normally contained in a package made of ceramic or a similar material. Known techniques for preparing ceramic packages include sintering and stacking, with which packages are molded under pressure. With a stacking method, several pasty metal layers are formed on a green sheet by screen printing to produce inner leads and then sintered at high temperature around 1,500° C.

A conventional semiconductor device in a ceramic package prepared by stacking will be described in greater detail by referring to FIGS. 13 through 17 of the accompanying drawings. Of these, FIG. 13 is a schematic perspective view of a conventional semiconductor device and FIG. 14 is a schematic plan view of an area surrounded by a circle A in FIG. 13. FIG. 15 is a schematic perspective view of part of the device, illustrating some of the inner leads and the semiconductor substrate of the device in an enlarged scale. The semiconductor substrate 1 which is typically made of silicon and carries an integrated circuit thereon is placed at the center of a mounting portion 2 of a ceramic substrate of, for example, aluminum nitride. The mounting portion 2 has substantially a square configuration and supports a semiconductor substrate at the center portion. Ceramic layers are formed on the periphery of the mounting portion 2. Inner leads 3 and 4 are formed on the ceramic layers to surround the semiconductor substrate 1. The inner leads are realized in a two-layer structure having a lower layer for the inner leads 3 operating as power supply leads and an upper layer for the inner leads 4 operating as signal transmission leads. End portions of the inner leads 4 which are connected to external terminals are covered by a ceramic layer that supports the inner leads 3 of the mounting portion 2.

The other ends of the inner leads 4 are exposed and opposite to the semiconductor substrate 1. End portions of the inner leads 3 which are connected to external terminals are covered by a ceramic layer that supports external terminals of the mounting portion 2. The other end of the inner leads 3 is exposed and opposite to the semiconductor substrate 1. The center portion of the mounting portion 2 constitutes a cavity 8 having a bottom 5, on which a power supply layer is arranged. The semiconductor substrate 1 carrying thereon an integrated circuit is fixed to the mounting portion 2 by using an electrically conductive adhesive agent 6 such as epoxy resin. The inner leads 3 and 4 are connected to electrodes (not shown) such as signal transmission pads and power supply pads. The power supply leads of the inner leads 3 are connected to the power supply layer at the cavity bottom 5. The external terminals 9 are pin-shaped and provided on the surface region of a peripheral region of mounting portion 2 and electrically connected to the inner leads 3 and 4 by way of conductive layers formed within the mounting portion 2. The semiconductor substrate 1, bonding wires and other components are sealed by means of a cap (not shown).

A conventional semiconductor device having a configuration as described above comprises a mounting portion for carrying thereon a semiconductor substrate on which two or more layers of inner leads are superposed to produce a multilayer structure. The inner lead layer for signal transmission is provided separately from the inner lead layer for power supply, so that the device has a good high frequency characteristic. The semiconductor substrate is mounted on a cavity formed in the center portion of the mounting portion. The cavity has a substantially square profile that matches the profile of the semiconductor substrate. The mounting portion also has a substantially square profile. Thus, bonding wires of the device have different lengths that vary depending on their relative locations on the semiconductor substrate. Those of the bonding wires located at the corners of the semiconductor substrate are much longer than those located at the middle of the edges. The differences in the length of the bonding wires are reflected in differences in the electric resistance of the wires, and these differences in the electric resistance can significantly affect the performance of the device particularly at high frequencies. This wire length dependency of the electric properties of the external terminals (pins) of a semiconductor device can by turn seriously affect the performance of the integrated circuit formed on the semiconductor substrate particularly in view of the fact that more and more semiconductor devices are designed to operate at high frequencies.

Depending on the type of the semiconductor substrate fitted in the cavity, the latter may be made to have a selected electric potential in order to make the device adapted for a large electric current and/or high speed operation. However, as more and more large wafers and chips (semiconductor substrates) are used for semiconductor devices these days, they inevitably tend to become thicker and show a height greater than 290 μm, which is currently prevalent and with which the inner leads can be bonded to the cavity section of the mounting portion without difficulty (FIG. 15). However, if a large semiconductor substrate show a height greater than 350 μm, the tool being used for the bonding operation can hit some of the corners of the semiconductor substrate (chip) to obstruct the operation.

This problem will be described in greater detail by referring to FIGS. 16 and 17 illustrating cross sectional views of part of a mounting portion carrying thereon a semiconductor substrate (chip) and other components of a semiconductor device. In FIG. 16, there are shown a chip bonded to the mounting portion 2 by means of an electrically conductive adhesive agent 6, a bonding wire 7 and a bonding tool BT. In FIG. 17, the chip 1 is secured to the mounting portion 2. As described above, a metal layer is formed on the cavity bottom 5 of the mounting portion 2 as a power supply layer. The arrows in FIG. 16 indicate the directions along which the bonding tool BT is moved. Assume here that the inner lead (power supply lead) 3 opposing the semiconductor substrate 1 is connected to the power supply layer on the cavity bottom 5 by a bonding wire 7.

Then, the bonding tool BT is moved from the inner lead 3 toward the cavity bottom 5 and, as it comes down, it can accidentally hit a corner (surrounded by a circle) of the chip 1 to cut the bonding wire 7. Therefore, in order to prevent such an accident from occurring, the chip 1 and the inner lead 3 have to be separated from each other by a sufficiently large distance. The probability with which the bonding tool BT hits a corner of the chip 1 in a bonding operation rises with the increase in the height of the chip 1. As seen from FIG. 17, if the chip 1 and the layer of the electrically conductive bonding agent 6 stand 350 μm and 60 μm respectively, the smallest length "x" of a bonding wire to be bonded to the cavity bottom 5 of a chip 1 by a bonding tool BT without touching the chip 1 will be $x = (350+60)/\tan 30° =$ 0.71 or about 0.8 mm including a safety margin, where 30° is the angle defined by the length "x" and the combined height of the chip and the layer of the electrically conductive bonding agent.

When chips having respective thicknesses of 290 µm, 350 µm and 450 µm are assessed for the probability with which the bonding tool BT accidentally hits a corner of the chip, the above defined angle may have any value between 0° and 45° for the bonding tool BT not to hit the corner if the chip is 290 µm high, whereas the angle have to be equal to or greater than 20° and 40° if the height of the chip is 350 µm and 450 µm respectively.

Thus, it can be concluded that with a semiconductor substrate that stands 350 µm or 450 µm, the operation of a bonding wire can be conducted only at corners where the wire to be bonded stretches over a relatively long distance. In other words, it is difficult to bond a wire to the cavity of a mounting portion if a large thickness chip is used, resulting in reduction of the electric performance of the finished semiconductor.

SUMMARY OF THE INVENTION

In view of these circumstances, it is therefore an object of the present invention to provide a semiconductor device that operates excellently in a high frequency range and whose electric performance is less subject to restrictions in terms of wire length dependency as defined above. Another object of the invention is to provide a semiconductor device with which the operation of bonding a wire to the cavity of the mounting portion can be carried out without restriction if a thick semiconductor substrate is used so that the device may operate well with an increased rate of electric current and an enhanced responsiveness.

According to the invention, the above objects and other objects of the invention are achieved by providing a semiconductor device comprising: a semiconductor substrate on which an integrated circuit is formed, a mounting portion having a cavity in which the semiconductor substrate is positioned; a plurality of inner leads including signal leads and power supply leads arranged on a peripheral region of a surface of the mounting portion, with their ends opposed to the semiconductor substrate; and bonding wires for connecting the ends of the inner leads to bonding pads formed on the semiconductor substrate; wherein lengths of the bonding wires for connecting the signal leads of the inner leads to the bonding pads are substantially equal to each other. Preferably, the inner leads may be arranged on surfaces of superposed ceramic layers partially overlapped with one another and formed along the periphery of the mounting portion, and an opening formed in that of the ceramic layers which supports the signal leads is a polygon having corners more than those of the substrate mounting portion. The inner leads may be formed on a surface of a single ceramic layer providing the cavity at a center portion thereof, the power supply leads and the signal leads are formed on the single ceramic layer, and an opening of the cavity is a polygon having corner more than those of the mounting portion. Assembly marks may be arranged on the bottom of the cavity.

The ceramic layer for supporting the signal transmission leads may have a stepped profile such that it includes predetermined areas lower than the remaining areas and the junctions of the bonding wires connected to the signal transmission leads in the predetermined areas are farther away from the semiconductor substrate than the junctions of the bonding wires connected to the signal transmission leads in the remaining areas. Alternatively, the ceramic layer for supporting the signal transmission leads may have a stepped profile such that areas of the layer located close to the corners of the mounting portion are higher than the remaining areas located close to the middle portion of the edges of the mounting portion. Still alternatively, the ceramic layer for supporting the power supply leads may have a stepped profile such that it includes predetermined areas lower than the remaining areas and the junctions of the bonding wires connected to the power supply leads in the predetermined areas are farther away from the semiconductor substrate than the junctions of the bonding wires connected to the power supply leads in the remaining areas.

According to another aspect of the invention, there is provided a semiconductor device comprising: a semiconductor substrate on which an integrated circuit is formed; a mounting portion having a cavity formed in a center portion of a major surface thereof, in which cavity the semiconductor substrate is positioned; a plurality of inner leads including signal leads and power supply leads arranged on a peripheral region of the major surface of the mounting portion, with their end portions opposed to the semiconductor substrate; and bonding wires for connecting the end portions of the inner leads to bonding pads formed on the semiconductor substrate or a power supply layer formed in the cavity; wherein the mounting portion has a ceramic layer for supporting the inner leads and the ceramic layer has a stepped profile such that a predetermined surface portion is lower than remaining surface portion and junctions of the bonding wires connected to the power supply leads in the predetermined lower surface portion are farther away from the semiconductor substrate than junctions of the bonding wires connected to the power supply leads in the remaining surface portion.

when the opening of the ceramic layer of the mounting portion for supporting the signal transmission leads of the inner leads or the cavity of the mounting portion is a polygon having corners more than those of the square mounting portion or when the ceramic layer has a stepped profile, the differences in the length of the bonding wires connecting the inner leads to the bonding pads of the semiconductor substrate can be minimized.

When the ceramic layer of the mounting portion for supporting the power supply leads has a stepped profile such that it include a predetermined surface portion lower than remaining surface portion and the power supply leads connected to the power supply layer formed on the bottom of the cavity by bonding wires are located in the lower surface portion, wires can be effectively bonded to the cavity of the mounting portion if the semiconductor substrate is made of a large thickness chip and the cavity may be held to a predetermined electric potential that enables the device to operate with an increased rate of electric current and an enhanced responsiveness.

Now, the present invention will be described in greater detail by referring to the accompanying drawings that illustrate preferred embodiments of the invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is an enlarged schematic sectional side view of part of the seventh embodiment;

FIG. 12 is an enlarged schematic perspective view of part of an eighth embodiment of semiconductor device according to the invention;

DETAILED DESCRIPTION OF THE PREFERRED EMBODIMENTS

Figure 1:
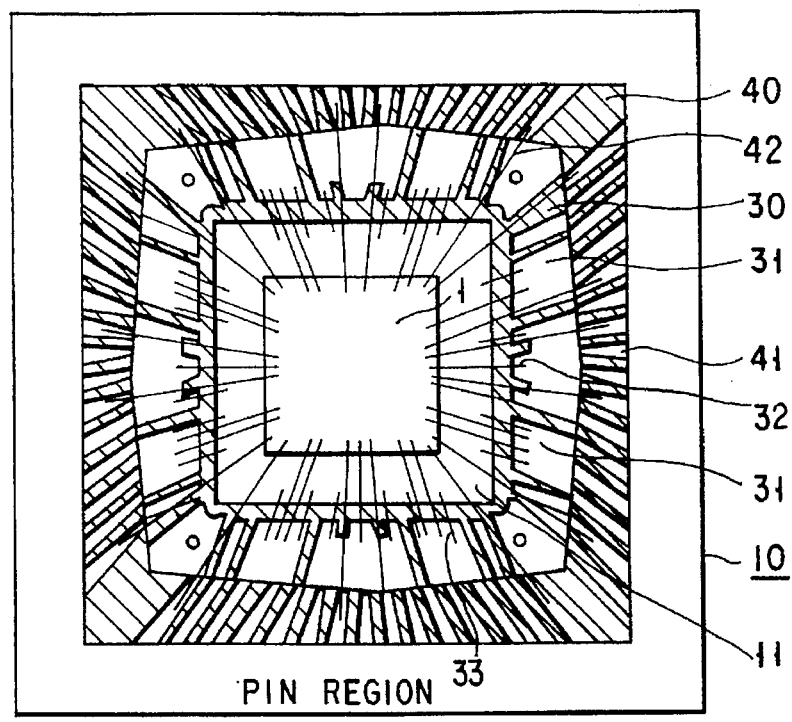
FIG. 1 is a schematic plan view of a first embodiment of semiconductor device according to the invention.
Figure 2:
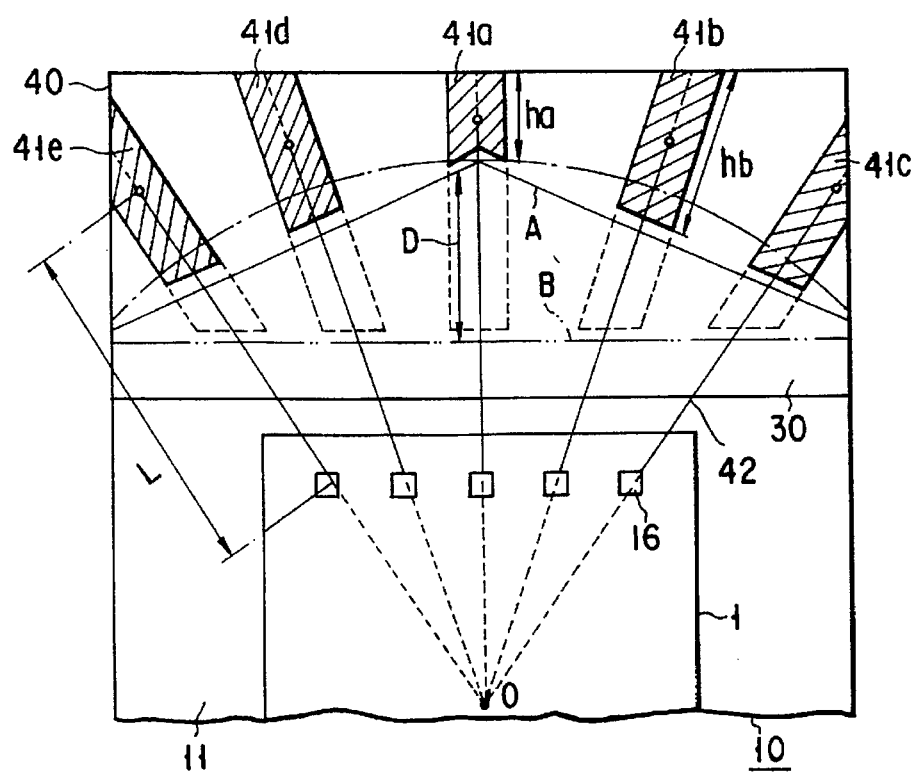
FIG. 2 is an enlarged schematic partial plan view of the first embodiment of FIG. 1.
Figure 3:
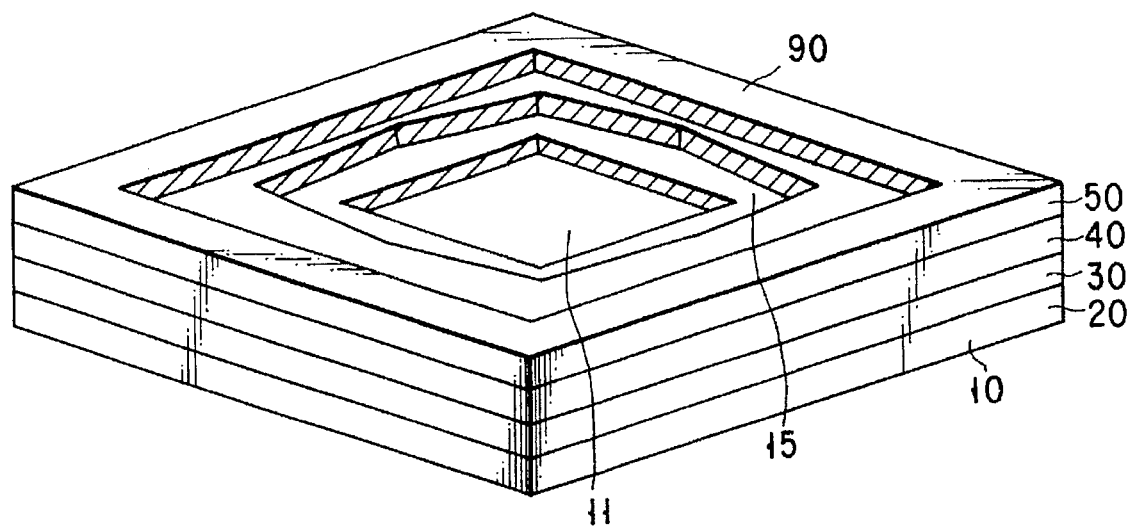
FIG. 3 is a schematic perspective view of the mounting portion of the embodiment of FIG. 1.
Figure 13:
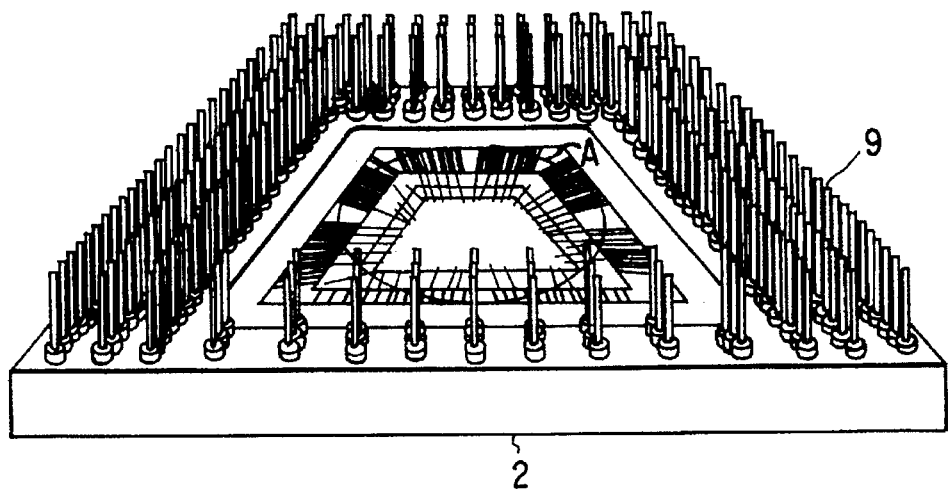
FIG. 13 is a schematic perspective view of a conventional semiconductor device.
Figure 14:
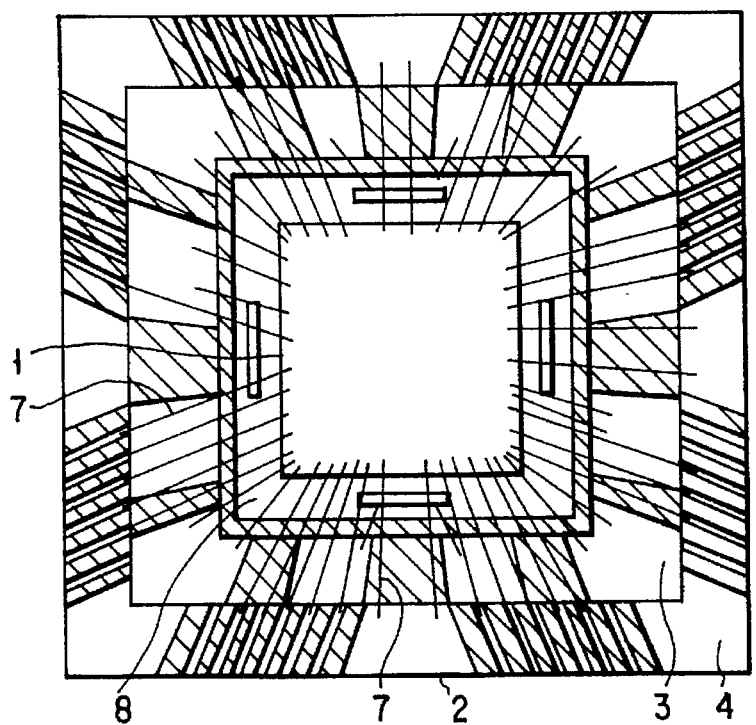
FIG. 14 is an enlarged schematic partial plan view of the device of FIG. 13, showing the area surrounded by circle A in FIG. 13.
Figure 15:
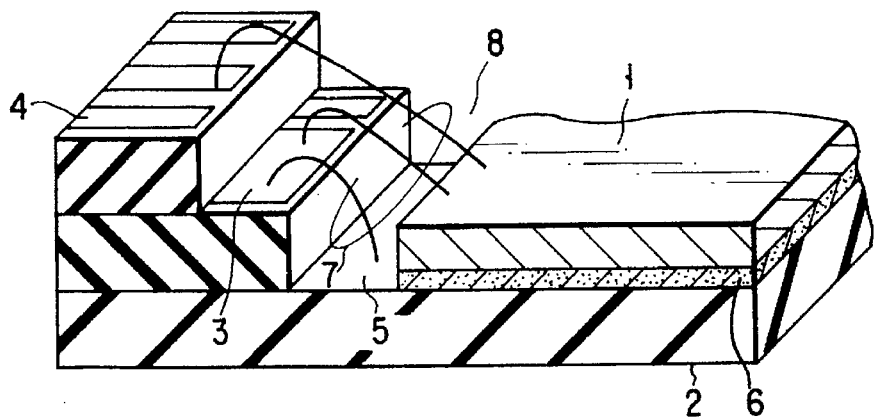
FIG. 15 is an enlarged schematic perspective view of part of another conventional semiconductor device.
Figure 16:
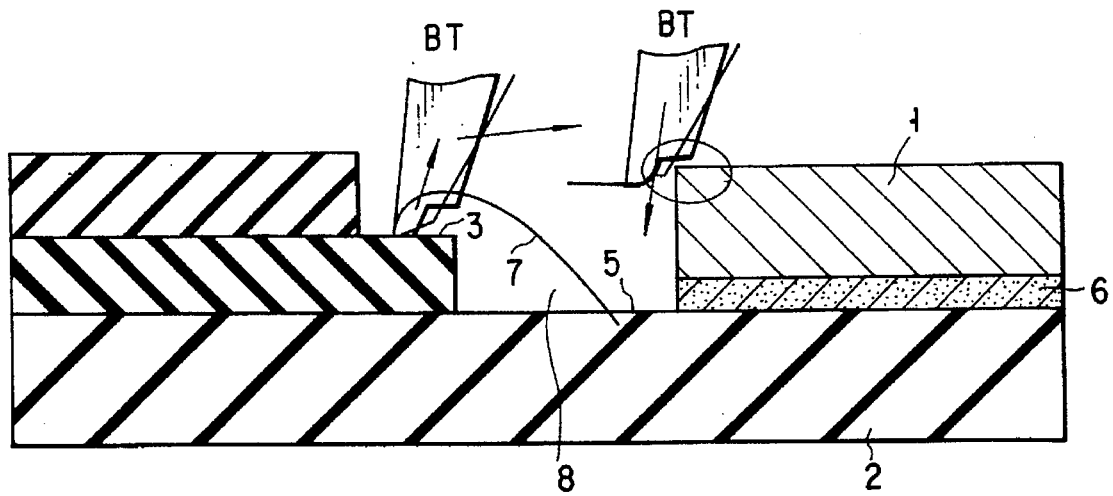
FIG. 16 is an enlarged schematic partial sectional side view of the device of FIG. 15, illustrating the use of a bonding tool.
Figure 17:
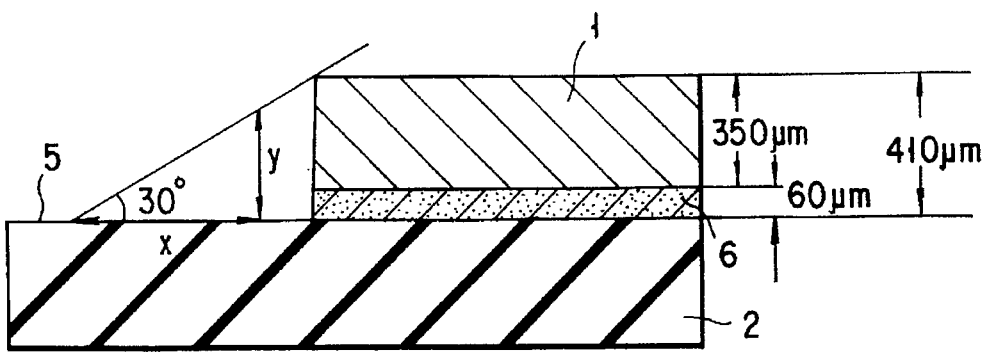
FIG. 17 is another enlarged schematic partial sectional side view of the device of FIG. 15, illustrating the problem that may arise when a bonding tool is used.

Firstly, a first embodiment of the invention will be described by referring to FIGS. 1 through 3, of which FIG. 1 shows a schematic plan view of the embodiment and FIG. 2 shows an enlarged schematic partial plan view of the embodiment, illustrating particularly how bonding wires are arranged to connect respective inner leads and corresponding bonding pads of the semiconductor substrate. FIG. 3 shows a schematic perspective view of the mounting portion. While the external terminals of this embodiment of semiconductor device are not shown and only the area dedicated to external terminals is schematically shown in FIG. 1, although they may be arranged in manner similar to that of arrangement of the external terminals 9 of FIG. 13. They are typically arranged in three rows into that area.

A semiconductor device carrying thereon an IC or LSI is contained in a ceramic package and located on a mounting portion of the package for a semiconductor substrate. Known techniques for preparing such a mounting portion include sintering and stacking, with which the mounting portion is molded under pressure. With a stacking method, several pasty metal layers are formed on a green sheet by screen printing to produce inner leads and then sintered at high temperature around 1,500° C. The mounting portion of a ceramic package prepared by stacking as in the case of the mounting portion of this embodiment comprises a number of ceramic layers, of which one or more have an opening.

The mounting portion will be described in detail below by referring to FIG. 3. The mounting portion 10 comprises a ceramic substrate 20, a first ceramic layer 30, a second ceramic layer 40, the first and second layers 30 and 40 containing inner leads arranged in peripheral areas thereof, and a third layer 50 having an area (pin area) 90 for producing external terminals along the outer periphery of the mounting portion, external terminals being arranged in the pin area. The arrangement of the external terminals in the pin area 90 is substantially similar to that of the terminals shown in FIG. 13. For the electric .connection of the external terminals (pins) and the inner leads, contact-holes are formed through the first and second ceramic layers of the mounting portion 10 and filled with a electrically conductive material for produce electrically conductive contact layers. A substantially square cavity 11 is formed at the center portion of the mounting portion 10 for arranging a semiconductor substrate 1 and surrounded by the first layer 30 containing inner leads. A metal layer (not shown) is formed on the bottom of the cavity and serves as a power supply layer. In this embodiment, power supply leads 31 are formed in the first layer 30 (FIG. 1). The second layer 40 is arranged on the surface portion of the first layer 30 to cover the first layer 30 in an area close to the edges of the mounting portion 10, although the remaining area reserved for bonding leads and located close to the semiconductor substrate 1 is exposed.

The second layer 40 is arranged along the periphery of the mounting portion 10 to :surround the cavity 11 and have an octagonal opening 15. In other words, two adjacent edges of the opening 15 correspond to a single edge of the mounting portion 10. The inner leads contained in the second layer 40 serve as signal transmission leads (FIG. 1). The third layer 50 is formed on the surface portion of the second layer 40. The third layer 50 covers the second layer 40 in an area close to the edges of the mounting portion 10, although the remaining area reserved for bonding leads and located close to the semiconductor substrate 1 is exposed. The third layer 50 is arranged along the periphery of the mounting portion 10 to surround the cavity 11 and have a square opening. The third layer 50 is the uppermost layer and external terminals 9 are arranged therein as may be understood by referring to FIG. 13.

The semiconductor substrate 1 is mounted on the mounting portion 10 in a manner as described below by referring to FIG. 1. The semiconductor substrate 1 is typically made of silicon and carries thereon an IC and disposed at the center portion of the mounting portion 10 of a substrate which is made of ceramic such as aluminum nitride. Inner leads 31, 41 are arranged in a peripheral region of the mounting portion 10 to surround the edges of the semiconductor substrate 1. The inner leads are arranged in layers and, specifically in the embodiment, comprises those serving as power supply leads 31 and disposed in the lower layer and those serving as signal leads 41 and disposed in the upper layer. The ends of the inner .leads 31 arranged in a peripheral region of the substantially square mounting portion 10 in order to be connected to external terminals are covered by the second layer 40 supporting the inner leads 41 on the mounting portion 10. The other ends of the inner leads 31 are exposed and opposed to the semiconductor substrate 1. The ends of the inner leads 41 to be connected to external terminals are covered by the third layer 50 supporting the external terminals on the mounting portion 10 while the other ends of the inner leads 41 are exposed and opposed to the semiconductor substrate 1. A cavity 11 is formed at the center portion of the mounting portion 10 for receiving a semiconductor substrate 1 and a power supply layer is formed on the bottom of the cavity 11. The semiconductor substrate 1 is bonded to the cavity 11 by means of an electrically conductive adhesive agent such as epoxy resin.

The inner leads 31 and 41 are connected to bonding pads (not shown) including signal transmission pads and power supply pads arranged on the surface portion of the semiconductor substrate 1 by means of bonding wires 32 and 42. The inner leads 31 are also electrically connected to the power supply .layer on the bottom of the cavity 11 by means of bonding wires 33. The pin-shaped external terminals are arranged in a pin receiving area (not shown) on the surface portion of a peripheral region of the mounting portion 10. The external terminals are electrically connected to the respective inner leads 31 and 41 by way of electrically conductive contact layers formed in the mounting portion 10. The semiconductor substrate 1, the bonding wires and the inner leads are sealed by a cap (not shown). In an aspect, this first embodiment is characterized by the profile of the opening 15 (FIG. 2) formed at the center portion of the second ceramic layer containing signal transmission leads to surround the cavity 11 of the mounting portion 10. More specifically, the opening 15 of the second layer 40 is an octagon having eight corners which is twice as many as four, or the number of corners of the mounting portion 10 which is substantially square. Thus, each of the edges of the mounting portion 10 corresponds to two edges of the opening 15 of the second layer 40, although the opening may have corners more than eight. Note that the differences in the length of the bonding wires can be reduced by increasing the number of corners of the opening of the second layer.

The signal transmission leads 41 on the second layer 40 are connected to the corresponding bonding pads (not shown) of the semiconductor substrate 1 by means of bonding wires 42 having substantially the same length. The bonding wires 32 connected to the power supply leads 31 of the first layer 30 are bonded to the corresponding bonding pads of the semiconductor substrate 1, whereas the bonding wires 33 are bonded to the metal layer (not shown) on the bottom of the cavity 11.

As the opening 15 of the second layer 40 containing the signal transmission leads 41 on the mounting portion 10 is octagonal, the signal transmission leads 41 can be safely bonded to the bonding pads (not shown) of the semiconductor substrate 1 by way of bonding wires 42 having the same or identical length.

The effect of the polygonal profile of the opening will now be discussed by referring to FIG. 2. In FIG. 2, the first ceramic layer 30 is only schematically shown and the power supply leads supported by the first ceramic layer are omitted. The semiconductor substrate 1 which is typically made of silicon is fixed to the cavity 11 of the mounting portion 10. FIG. 2 shows a part of the mounting portion 10 along an edge and close to a corner thereof as well as the semiconductor substrate arranged on the mounting portion 10. Bonding pad 16 are arranged in a row along the edge of the top surface of the semiconductor substrate 1 and electrically connected to the .integrated circuit formed on the semiconductor substrate 1. On the other hand, there is shown the second ceramic layer 40 laid on the first layer 30. Signal transmission leads 41 are formed on the second layer 40. The signal transmission leads 41 are arranged radially and connected by means of bonding wires running along the axial lines of the signal transmission leads and the dotted lines in FIG. 2 converging to the center 0 of the semiconductor substrate 1 from the bonding pads 16. The lateral edges and the upper edge of the second layer 40 are defined by respective solid lines in FIG. 2. While the inner edge of the second layer 40 is opposed to the semiconductor substrate 1 of a comparable conventional device may be defined by dotted broken line B, that of the present invention is defined by bent line A having an upward apex. Thus, the signal transmission lead 41a located at the middle portion of the edge has the shortest length (ha) of all, whereas the length of the remaining signal transmission leads increases toward the corners. The signal transmission lead 41b adjacent to the signal transmission lead 41a has a length (hb) greater than the length (ha) of the signal transmission lead 41a (ha<hb). The signal transmission lead 41a is shorter than the corresponding signal transmission lead of a comparable conventional device by D. On the other hand, all the bonding wires 42 respectively connecting the signal transmission leads 41 to the corresponding bonding pads 16 have the same or identical length of L.

Conventionally, each of the signal transmission leads of a semiconductor device is connected to a corresponding bonding pad by means of a bonding wire which is bonded to a predetermined convenient position of the lead. It is not practical to locate this junction at a position away from the corresponding bonding pad because the risk with which the bonding wire is broken by a corner of the second ceramic layer or some other layer that may accidentally hit the bonding wire increases as the junction moves toward the remote end of the signal transmission lead. In view of this risk, the bonding wires of conventional semiconductors device have different lengths depending on the relative positions of the corresponding signal transmission leads, making the devices not feasible for use at high frequencies. Contrary to this, a semiconductor device according to the present invention is free from the above problem because all the bonding wires have substantially the same or identical length. Note that, in this embodiment, the second layer 40 carrying the signal transmission leads 41 has a specifically designed profile adapted for making all the bonding wires have the same or identical length. In other words, the opening of the second layer 40 is octagonal so that the signal transmission leads located at and near the middle portion of each edge of the mounting portion 10 are made significantly shorter than the signal transmission leads located close to the related corners of the mounting portion 10. Differently stated, the second layer 40 is farther away from the related bonding pads 16 at and near the middle portion of the edges of the mounting portion 10 than at and near the corners of the mounting portion 10. With this arrangement, the junctions connecting the signal transmission leads 41 to the corresponding bonding wires may be located apart from the related bonding pads 16. Note that the opening 15 of the second layer 40 may alternatively have a circular profile to achieve a similar effect.

Now, a second embodiment of the invention will be described by referring to FIG. 4, which is a schematic plan view of the embodiment. While the external terminals of this embodiment of semiconductor device are not shown and only the area dedicated to external terminals is schematically shown in FIG. 4, although they may be arranged in manner similar to that of arrangement of the external terminals (pins) 9 of FIG. 13.

Figure 4:
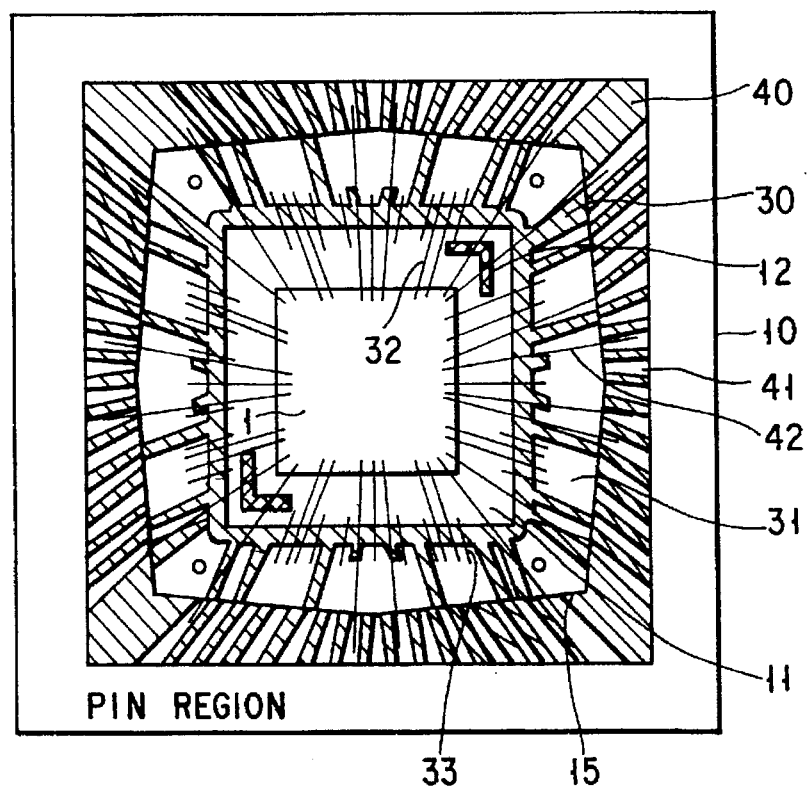
FIG. 4 is a schematic plan view of a second embodiment of semiconductor device according to the invention.

FIG. 4 is a schematic plan view of a second embodiment of semiconductor device according to the invention comprising a semiconductor substrate mounted on a mounting portion of a ceramic package. The semiconductor substrate 1 is fixed to the center portion of the mounting portion 10 made of a ceramic material and having a multilayer structure. A first ceramic layer 30 and a second ceramic layer 40 are arranged in layers along the periphery of the mounting portion 10 to surround the semiconductor substrate 1. The inner leads of the device comprises lower power supply leads 31 contained in the first ceramic layer 30 and upper signal transmission leads 41 contained in the second ceramic layer 40. The end portion of the power supply leads 31 located apart from the center portion of the semiconductor substrate 1 and connected to the respective external terminals are covered by the second layer 40 of the mounting portion 10, whereas the other end portions of the power supply leads 31 are exposed and opposed to the semiconductor substrate 1. The ends of the signal transmission leads 41 located apart from the center portion of the semiconductor substrate 1 and connected to the respective external terminals are covered by a third ceramic layer carrying a pin region and supporting the external terminals of the mounting portion 10, whereas the other ends of the signal transmission leads 41 are exposed and opposed to the semiconductor substrate 1.

A cavity 11 is formed at the center portion of the mounting portion 10 and the semiconductor substrate 1 is fixed to the cavity 11. A power supply layer is formed on the bottom of the cavity 11. The semiconductor substrate 1 is bonded to the cavity 11 by means of an electrically conductive adhesive agent such as epoxy resin. The power supply leads 31 and the signal transmission leads 41 are connected to respective bonding pads (not shown) arranged on the surface portion of the semiconductor substrate 1. The external terminals are pin-shaped and arranged in a peripheral area on the surface portion of the mounting portion 10 and electrically connected to the power supply leads 31 and the signal transmission leads 41 by way of electrically conductive contact layers formed in the mounting portion 10. The semiconductor substrate 1, the bonding wires and the inner leads are sealed by a cap (not shown). In this second embodiment (FIG. 4), the second layer 40 for supporting the signal transmission leads 31 has an octagonal opening 15 and therefore the opening has a number of corners greater than that of the substantially square mounting portion 10. More specifically, two edges of the octagonal opening 15 correspond to a single edge of the mounting portion 10. This second embodiment is characterized by assembly marks 12 arranged at predetermined positions on the bottom of the cavity 11. Because of the assembly marks, semiconductor substrate 1 can be centered with ease on the mounting portion 10 in the assembling process if the second layer 40 has an octagonal opening. While the semiconductor substrate of a comparable conventional semiconductor device can be centered on the mounting portion 10 by utilizing the rectangular corners of the square opening of the second layer of the device as marks for alignment, proper marks may have to be arranged for alignment if the opening of the second layer is polygonal and has more than four corners.

Figure 5:
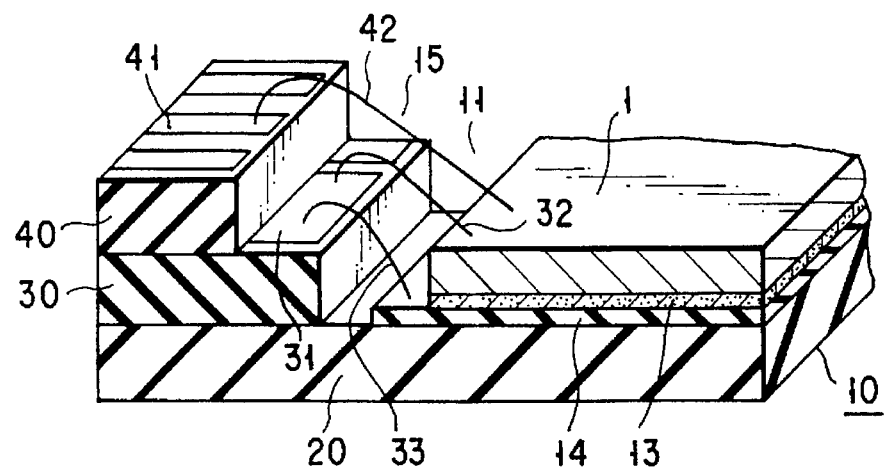
FIG. 5 is an enlarged schematic perspective view of part of a third embodiment of semiconductor device according to the invention.
Figure 6:
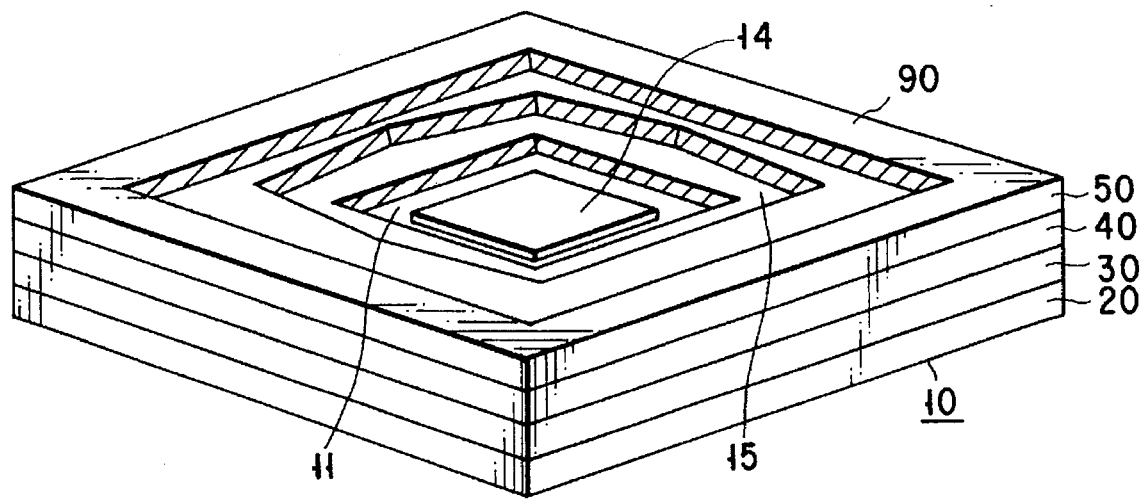
FIG. 6 is a schematic perspective view of the mounting portion of the third embodiment of FIG. 5.

A third embodiment of the invention will now be described by referring to FIGS. 5 and 6. FIG. 5 is an enlarged schematic perspective view of part of a third embodiment of semiconductor device according to the invention and FIG. 6 is a schematic perspective view of the mounting portion of the embodiment of FIG. 5. This third embodiment has a configuration substantially equal to that of the first embodiment. The mounting portion 10 of this embodiment comprises a first layer 30 and a second layer 40 arranged to form a multilayer structure along the periphery of the mounting portion 10 as well as a region for external terminals (pin region) 90 also arranged along the periphery of the mounting portion 10, where the external terminals are arranged. The external terminals are arranged in a manner similar to that of arrangement of the external terminals of FIG. 13. The external terminals (pins) and the corresponding inner leads are electrically connected by way of electrically conductive contact layers formed in contact holes bores formed in the ceramic plate of the mounting portion 10. A cavity 11 is formed at the center portion of the mounting portion 10 for carrying the semiconductor substrate 1 thereon. The cavity 11 has a substantially square plan view and a recessed profile as it is surrounded by the first layer 30 carrying inner leads. A metal layer (not shown) is typically formed on the bottom of the cavity 11 and serves as a power supply layer. In this third embodiment, the inner leads in the first layer 30 are power supply leads.

A second layer 40 is formed on the upper surface portion of the first layer 30 also carrying inner leads. While the first layer 30 is covered by the second layer 40 at an area close to the edges of the mounting substrate 10, it is exposed at the remaining area located close to the semiconductor substrate 1 and used for bonding. The second layer 40 is also arranged along the periphery of the mounting portion 10 to surround the cavity 11 and has an octagonal opening 15. More specifically, two edges of the opening 15 correspond to a single edge of the mounting portion 10. A third layer 50 on which external terminals (not shown) are arranged is arranged on the upper surface portion of the second layer 40. While the second layer 40 is covered by the third layer 50 at an area close to the edges of the mounting portion 10, it is exposed at the remaining area located close to the semiconductor substrate 1 and used for bonding. The third layer 50 is also arranged along the periphery of the mounting portion 10 to surround the opening 15 and has a substantially square opening. As described above, external terminals (pins) 9 are arranged in the third layer 50 which is the upper-most layer of the multilayer structure on the mounting portion 10 so that a pin region is formed on the third layer 50.

This third embodiment is characterized by a mounting plate 14 bonded on the metal layer (not shown) that serves as a power supply layer arranged on the bottom of the cavity 11. The mount plate 14 is of a two-layered structure having a ceramic plate and a metal layer formed thereon, the metal being typically gold. The metal layer on the ceramic layer is electrically isolated from the metal layer on the bottom of the cavity 11. In other words, the lower surface portion of the semiconductor substrate 1 and the bottom of the cavity 11 may have different electric potentials. The signal transmission leads 41 of the second layer 40 are electrically connected to respective bonding pads (not shown) arranged on the semiconductor substrate 1 by way of bonding wires 42 having substantially the same or identical length. The bonding wires 32 connected to the power supply leads 31 of the first layer 30 are bonded to respective bonding pads arranged on the semiconductor substrate 1, while the remaining bonding wires 33 are connected to the metal layer (not shown) of the mounting plate 14 to make the electric potential of the back side electrode of the semiconductor substrate 1 equal to that of the power supply leads 31. Thus, as the second layer 40 of the mounting portion 10 carrying the signal transmission leads 41 has an octagonal opening 15, while the mounting portion is substantially square, the bonding wires 42 can be bonded to the signal transmission leads 41 and the bonding pads (not shown) on the semiconductor substrate 1 without difficulty. Additionally, all of the signal transmission leads 41 of the second layer 40 may have substantially the same or identical length and the signal transmission leads arranged at and near the center portion of the edges of the mounting portion 10 may be bonded to the respective bonding wires at locations away from the center portion of the semiconductor substrate 1.

Figure 7:
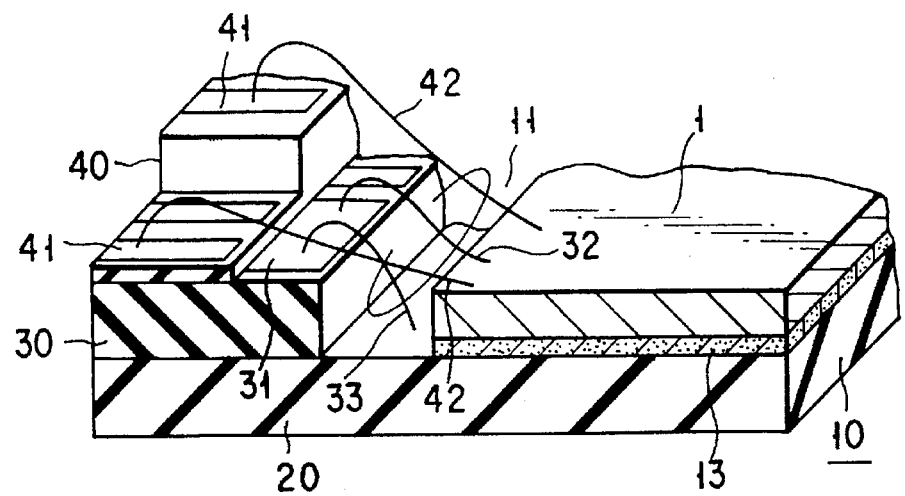
FIG. 7 is an enlarged schematic perspective view of part of a fourth embodiment of semiconductor device according to the invention.

A fourth embodiment of the invention will now be described by referring to FIG. 7, which is an enlarged schematic perspective view of part of the fourth embodiment of semiconductor device according to the invention. In FIG. 7, there is shown a multilayer structure having ceramic layers, bonding wires and a semiconductor substrate. The mounting portion 10 of this embodiment comprises a first ceramic layer 30 and a second ceramic layer 40 arranged along the periphery thereof as well as external terminals (not shown) arranged on a peripheral area of the mounting portion 10. The arrangement of the external terminals 9 are similar to that of FIG. 13. The external terminals and the inner leads of the device are electrically connected by way of electrically conductive contact layers formed in the contact holes of the ceramic layers of the mounting portion 10. A cavity 11 is formed at the center portion of the mounting portion 10 and the semiconductor substrate 1 is arranged thereon. The cavity 11 has a substantially square plan view and is surrounded by the first layer 30 containing therein inner leads and arranged along the periphery of the mounting portion 10 so that the cavity 11 has a recessed profile. A metal layer (not shown) serving as a power supply layer is formed on the bottom of the cavity 11. The inner leads of the first layer 30 are power supply leads 31. A second layer 40 also containing inner leads is arranged on the upper surface portion of the first layer 30. While a surface area of the first layer 30 which is near the edges of the mounting portion 10 is covered by the second layer 40, the remaining surface area of the first layer 30 which is close to the semiconductor substrate 1 is exposed for bonding. The second layer 40 is located close to the periphery of the mounting portion 10 to surround the cavity 11.

The inner leads of the second layer 40 are signal transmission leads. A third layer (not shown) is formed on the upper surface portion of the second layer 40 and external terminals are arranged on the surface portion of the third layer. While a surface area of the second layer 40 which is near the edges of the mounting portion 10 is covered by the third layer 50, the remaining surface area of the second layer .40 which is close to the semiconductor substrate 1 is exposed for bonding.

The above described fourth embodiment of the invention is characterized by the profile of the second ceramic layer 40 carrying signal transmission leads. More specifically, the surface portion of the second layer 40 is lower in a predetermined region than in the remaining region, although the low region is still higher than the first layer 30.

While the second ceramic layer 40 carrying signal transmission leads has a polygonal opening at the center portion in each of the above described first through third embodiments in order to use bonding wires having substantially the same or identical length, the fourth embodiment is characterized in that its second layer 40 has a stepped profile to produce a region that is lower than the remaining region. Thus, the bonding wires are connected to the respective signal transmission leads at positions located in the low region which is away from the center portion of the semiconductor substrate 1 and close to the edges of the mounting portion 10.

The signal transmission leads on the second layer 40 are connected to the corresponding bonding pads (not shown) arranged on the semiconductor substrate 1 by way of respective bonding wires 42 having substantially the same or identical length. The power supply leads 31 of the first layer 30 are connected to the corresponding bonding pads arranged on the semiconductor substrate 1 by way of respective bonding wires 32 while another set of bonding wires 33 are bonded to the power supply layer (not shown) on the bottom of the cavity 11.

Thus, by forming a low region close to the edges of the mounting portion 10 on the second layer 40 carrying signal transmission leads 41, the latter may be connected to the respective bonding wires at locations far from the semiconductor substrate 1 and hence bonding wires having the same or identical length may be used regardless of the positions of the pins so that the wire length dependency of the electric properties of the device can be minimized.

Figure 8:
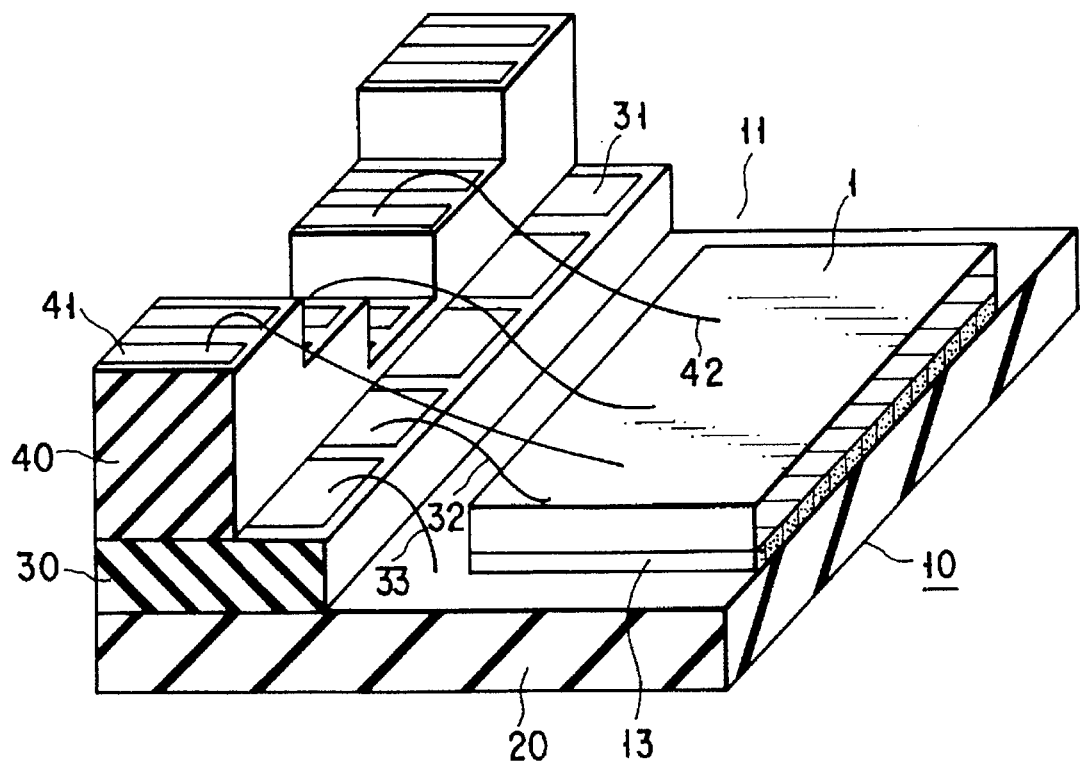
FIG. 8 is an enlarged schematic perspective view of part a fifth embodiment of semiconductor device according to the invention.

Now, a fifth embodiment of the invention will be described by referring to FIG. 8, which is an enlarged schematic perspective view of part of the fifth embodiment of semiconductor device according to the invention. In FIG. 8, there is shown a multilayer structure having ceramic layers, bonding wires and a semiconductor substrate. The mounting portion 10 of this embodiment comprises a first ceramic layer 30 and a second ceramic layer 40 arranged along the periphery thereof as well as external terminals (not shown) arranged on a peripheral area of the mounting portion 10. A cavity 11 is formed at the center of the mounting portion 10 and surrounded by the first ceramic layer 30 and a metal layer (not shown) is formed on the bottom of the cavity 11 to serve as a power supply layer. The inner leads formed on the first layer 30 are power supply leads 31. The second layer 40 is arranged on the upper surface of the first layer 30. While a surface area of the first layer 30 which is near the edges of the mounting portion 10 is covered by the second layer 40, the remaining surface area of the first layer 30 which is close to the semiconductor substrate 1 is exposed for bonding. The second layer 40 is located close to the periphery of the mounting portion 10 to surround the cavity 11. The inner leads formed on the second layer 40 are signal transmission leads. A third layer (not shown) is formed on the upper surface of the second layer 40 and external terminals are arranged on the surface portion of the third layer. While a surface area of the second layer 40 which is near the edges of the mounting portion 10 is covered by the third layer 50, the remaining surface area of the second layer 40 which is close to the semiconductor substrate 1 is exposed for bonding.

The above described fifth embodiment is characterized by the profile of the second ceramic layer 40 carrying the signal transmission leads. As seen from FIG. 8, the second layer 40 is made lower toward the center portion of each edge of the mounting portion 10 and becomes highest at each corner of the mounting portion 10 to show a stepped profile, although the lowest central portion is still higher than the underlying first layer. By bonding a bonding wire to a corresponding signal transmission lead at a lowest portion of the second layer 40, the junction may be located away from the center portion of the semiconductor substrate 1 (or close to the corresponding edge of the mounting portion 10). Thus, all of the signal transmission leads 41 on the second layer 40 may be electrically connected to corresponding bonding pads (not shown) on the semiconductor substrate 1 by means of bonding wires having substantially the same or identical length. The power supply leads 31 of the first layer 30 are connected to the corresponding bonding pads arranged on the semiconductor substrate 1 by way of respective bonding wires 32 while another set of bonding wires 33 are bonded to the power supply layer (not shown) on the bottom of the cavity 11. Thus, by forming a low region close to the edges of the mounting portion 10 on the second layer 40 carrying signal transmission leads 41, the latter may be connected to the respective bonding wires at locations away from the semiconductor substrate 1 and hence bonding wires having substantially the same or identical length may be used regardless of the positions of the pins so that the wire length dependency of the electric properties of the device can be minimized. By using a second layer 40 having an octagonal opening 15 and carrying signal transmission leads 41 for the mounting portion 10 which is substantially square, the bonding wires 42 can be bonded to the signal transmission leads 41 and the bonding pads (not shown) on the semiconductor substrate 1 without difficulty. Additionally, all of the signal transmission leads 41 of the second layer 40 may have the same or identical length.

Figure 9:
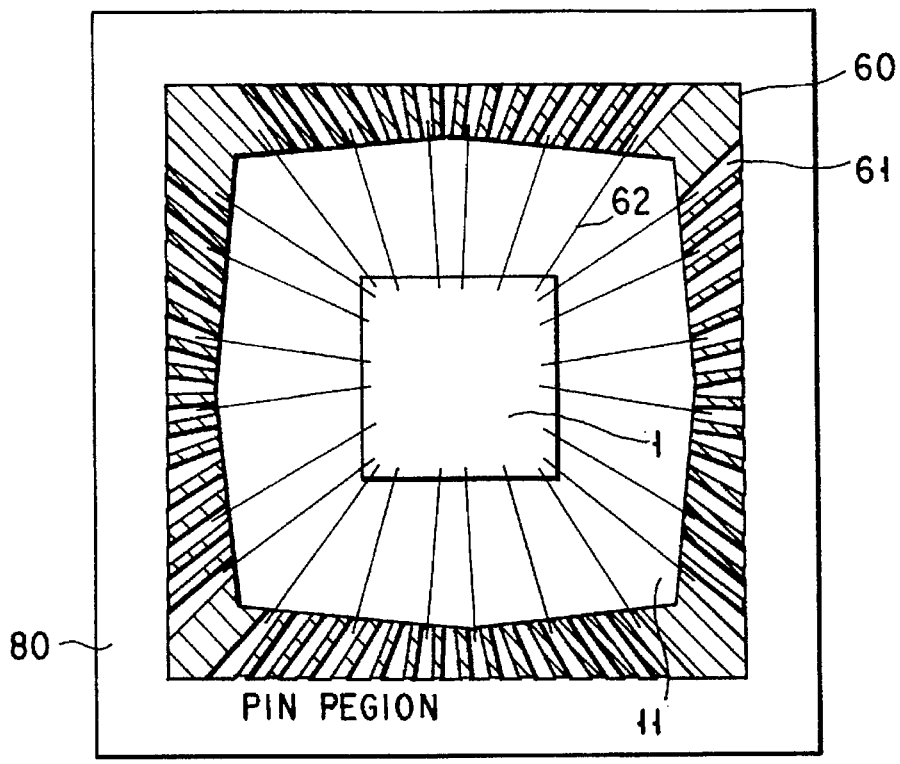
FIG. 9 is a schematic plan view of a sixth embodiment of semiconductor device according to the invention.

A sixth embodiment of the invention will now be described by referring to FIG. 9, which is a schematic plan view of the sixth embodiment of semiconductor device according to the invention. Although the external terminals of this embodiment are not shown and only a region reserved for them (pin region) is indicated in FIG. 9, the arrangement of the external terminals 9 of this embodiment are similar to that of FIG. 13. A semiconductor substrate 1 is disposed at the center portion of a mounting portion 10 having a multilayer structure that comprises a number of ceramic layers. More specifically, the mounting portion 10 of this embodiment comprises a first ceramic layer 60 and inner leads 61 are arranged on the first layer 60. The inner leads 61 are signal transmission leads and power supply leads. The ends of the inner leads 61 disposed along the periphery of the mounting portion 10 in order to be connected to the external terminals are covered by a second ceramic layer 70 carrying a pin region 80 for supporting the external terminals, while the other ends of the inner leads are exposed and is opposed to the semiconductor substrate 1. A cavity 11 is formed at the center portion of the mounting portion 10 to carry the semiconductor substrate 1 and a power supply layer is formed on the bottom of the cavity 11. The semiconductor substrate 1 is fixed to the bottom of the cavity 11 by means of an electrically conductive adhesive agent such as epoxy resin. The inner leads 61 are connected to corresponding bonding pads (not shown) arranged on the surface portion of the semiconductor substrate 1 by way of respective bonding wires 62. All of the bonding wires 62 have substantially the same or identical length.

The external terminals (not shown) are arranged in the region 80 arranged in a peripheral area on the surface of the mounting portion 10 and electrically connected to the inner leads 61 by way of electrically conductive contact layers formed in the mounting portion 10. The semiconductor substrate 1, the bonding wires and the inner leads are sealed by a cap (not shown). In this embodiment, the opening of the second layer 60 is octagonal so that two edges of the opening correspond to a single edge of the cavity 11.

As noted earlier, the inner leads of a semiconductor device of the type under consideration are conventionally bonded to bonding wires at convenient locations thereof. In other words, the junctions of the inner leads and the bonding wires are not located apart from the center portion of the semiconductor substrate 1 and hence from the bonding pads of the device in order to avoid the risk of hitting and breaking the bonding wires by the corners of the ceramic layers. Thus, the bonding wires of a conventional comparable device have different lengths depending on their relative locations on the mounting portion, making the device poorly adapted for operation at high frequencies. A semiconductor device according to the invention is, to the contrary, free from this problem.

The first layer 60 of the above described sixth embodiment also has a specifically designed profile. The opening formed at the center of the first layer is octagonal so that the inner leads located at and near the middle portion of the edges of the mounting portion 10 can be made shorter than their counterparts of a comparable conventional device. Consequently, the distance between the bonding pads located at and near the middle portion of the edges and the first layer is longer than the counterpart of a comparable conventional device. Thus, the junctions of the inner leads and the corresponding bonding wires can be arranged away from the center portion of the semiconductor substrate and hence from the corresponding bonding pads. Note that the inner leads of this embodiment are realized in the form of a lead frame.

Figure 10:
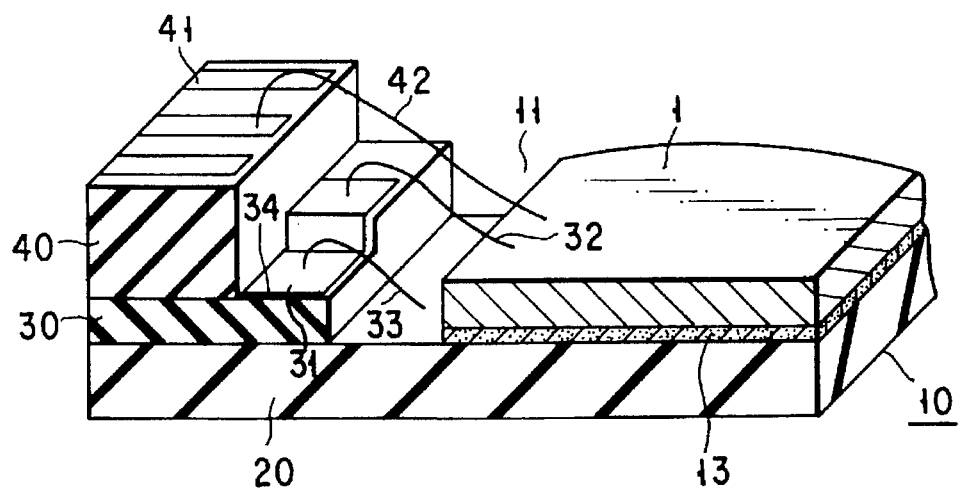
FIG. 10 is an enlarged schematic perspective view of part of a seventh embodiment of semiconductor device according to the invention.

A seventh embodiment of the invention will now be described by referring to FIGS. 10 and 11, of which FIG. 10 is an enlarged schematic perspective view showing the inner leads and part of the cavity of the mounting portion and FIG. 11 is an enlarged schematic sectional side view of part of the embodiment, illustrating its effect. A cavity 11 is formed at the center of the mounting portion 10 and the semiconductor substrate 1 of the device is fixed to the cavity 11 by means of an electrically conductive adhesive agent 13. The mounting portion 10 carries thereon a ceramic substrate 20, which by turn carries a first layer 30 containing power supply leads 31 and a second layer 40 containing signal transmission leads 41. The signal transmission leads 41 are connected to corresponding bonding pads (now shown) arranged on the semiconductor substrate 1 by way of respective bonding wires 42, while the power supply leads 41 are connected to corresponding bonding pads (not shown) also arranged on the semiconductor substrate 1 by way of respective bonding wires 32. The power supply leads 31 and the power supply layer (now shown) formed on the bottom of the cavity 11 are also connected by bonding wires 33. The power supply leads 31 arranged on the low profile regions 34 of the second layer 40 are connected to bonding wires 33, which can be bonded to the corresponding power supply leads 31 at locations apart from the center portion of the semiconductor substrate 1.

A seventh embodiment of the invention will now be described by referring to FIG. 11.

While efforts have been made to realize downsized semiconductor devices, the clearance X between the first ceramic layer 30 and the semiconductor substrate 1 fixed to the cavity 11 of the mounting portion 10 by means of an electrically conductive adhesive agent 13 requires a minimum distance for arranging bonding wires. Thus, if no low profile regions 34 are arranged and the power supply leads on the first layer 30 are bonded to corresponding bonding wires at locations apart from the semiconductor substrate 1, the bonding wires 35 can often encounter the risk of being hit and broken by the edges (as indicated by a circle in FIG. 11) of the first layer 30. Additionally, the operation of bonding the wires can be seriously obstructed if the bonding tool abuts the semiconductor substrate. These inconvenient situations are avoided by the stepped profile of the first layer 30 as the clearance X is increased by ΔX to become equal to y at the low profile regions 34.

Finally, an eighth embodiment of the invention will be described by referring to FIG. 12, which is an enlarged schematic perspective view of part of the embodiment having a multilayer structure comprising a semiconductor substrate, ceramic layers, bonding wires and other components. The mounting portion 10 of this embodiment comprises a first ceramic layer 30 and a second ceramic layer 40 arranged along the periphery thereof and containing inner leads as well as external terminals (not shown) arranged on a peripheral area of the mounting portion 10. The arrangement of the external terminals 9 are similar to that of FIG. 13. The external terminals and the inner leads of the device are electrically connected by way of electrically conductive contact layers formed in the contact holes of the ceramic layers of the mounting portion 10. A cavity 11 is formed at the center portion of the mounting portion 10 and the semiconductor substrate 1 is arranged thereon. More specifically, the semiconductor substrate 1 is bonded to a mounting plate 14 (See FIG. 5.) arranged in the cavity 11 by means of an electrically conductive adhesive agent 13. The cavity 11 is surrounded by the first layer 30 containing therein inner leads and arranged along the periphery of the mounting portion 10 so that the cavity 11 has a recessed profile. A metal layer (not shown) serving as a power supply layer is formed on the bottom of the cavity 11. The inner leads of the first layer 30 are power supply leads 31. A second layer 40 also containing inner leads is arranged on the upper surface of the first layer 30. While a surface area of the first layer 30 which is near the edges of the mounting portion 10 is covered by the second layer 40, the remaining surface area of the first layer 30 which is close to the semiconductor substrate 1 is exposed for bonding. The second layer 40 is located close to the periphery of the mounting portion 10 to surround the cavity 11.

The above described embodiment is characterized by the profile of the first ceramic layer 30 and that of the second ceramic layer 40. More specifically, both the first and second layers have a stepped profile to show low profile regions, although the low profile regions of the second layer is higher than the underlying first layer. The junctions of the inner leads and the corresponding bonding wires in these low profile regions can be located away from the semiconductor substrate 1 (and hence close to the edges of the mounting portion 10). All the signal transmission leads 41 on the second layer 40 are electrically connected to corresponding bonding pads (not shown) on the semiconductor substrate 1 by way of bonding wires having the same or identical length. All of the bonding wires 32 connected to the power supply leads 31 of the first layer 30 are also bonded to bonding pads on the semiconductor substrate 1 and another set of bonding wires are connected to the mounting plate 14 on the bottom of the cavity 11. Thus, by providing low profile regions 44 on the second layer 40 for supporting signal transmission leads, these signal transmission leads can be bonded to corresponding bonding wires at locations apart from the semiconductor substrate to make all of the bonding wires have substantially the same or identical length to eliminate any dependency of the electric properties of the device on the length of the bonding wires. Also, by arranging low profile regions 34 on the first layer 30 for supporting power supply leads, the clearance separating the semiconductor substrate 1 and the first layer 30 can be increased.

A semiconductor device according to the present invention is provided with a polygonal opening and/or low profiled regions formed in the ceramic layer for carrying signal transmission leads to surround the cavity of the mounting portion, all of the bonding wires connecting the signal transmission leads to the bonding pads of the semiconductor substrate may have the same or identical length so that: the dependency of the electric properties of the device on the length of the bonding wires can be eliminated to make the device excellently operate at high frequencies.

With such an arrangement, bonding wires can be bonded to the cavity of the mounting portion of the device without problem even if a very thick chip is used for the semiconductor substrate so that the device may be adapted for an increased rate of electric current and an enhanced responsiveness.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:

a semiconductor substrate on which an integrated circuit is formed;

a mounting portion having corners and having a cavity in which said semiconductor substrate is positioned;

a plurality of inner leads including signal leads and power supply leads arranged on a peripheral region of a surface of said mounting portion, with their ends opposed to said semiconductor substrate;

a plurality of superposed layers partially overlapped with one another and formed along the periphery of said mounting portion, said layers having surfaces on which said inner leads are arranged, and an opening formed in one of said superposed layers which supports said signal leads, the opening having more corners than said mounting portion; and bonding wires for connecting said ends of said inner leads to bonding pads formed on said semiconductor substrate;

wherein lengths of the bonding wires for connecting said signal leads, arranged on said one of the superposed layers, to said bonding pads are substantially equal to each other.

2. A semiconductor device according to claim 1, wherein assembly marks are arranged on the bottom of said cavity.

3. A semiconductor device according to claim 1, wherein the one of said superposed layers which supports said signal leads has a stepped profile such that it includes a predetermined surface portion lower than a remaining surface portion, and junctions of bonding wires connected to said signal leads in said lower surface portion are farther away from said semiconductor substrate than junctions of bonding wires connected to said signal leads in said remaining surface portion.

4. A semiconductor device according to claim 1, wherein the one of said superposed layers which supports said signal leads has a stepped profile such that a surface portion of said ceramic layer which is close to the corners of said mounting portion is higher than a remaining middle surface portion which is close to sides of the substrate mounting portion.

5. A semiconductor device according to claim 1, wherein one of said superposed layers supports said power supply leads and has a stepped profile in which said one ceramic layer includes a predetermined surface portion lower than a remaining surface portion, and junctions of said bonding wires connected to said power supply leads in said predetermined lower surface portion are farther away from the semiconductor substrate than junctions of said bonding wires connected to said power supply leads in said remaining surface portion.

6. A semiconductor device comprising:

a semiconductor substrate on which an integrated circuit is formed;

a mounting portion having a central cavity in which said semiconductor substrate is positioned, the central cavity having substantially linear sides joining at corners;

a plurality of inner leads including signal leads and power supply leads arranged on a peripheral region of a surface of said mounting portion, the inner leads having ends opposed to said semiconductor substrate and radiating away from the central cavity;

a plurality of superposed layers partially overlapped with one another and formed along the periphery of said mounting portion, the layers having surfaces on which said inner leads are arranged, and an opening formed in one of said superposed layers which supports said signal leads, the opening defining the ends of the inner leads opposed to said semiconductor substrate and being shaped as a polygon having a number of corners twice the number of corners of said central cavity; and bonding wires for connecting said ends of said inner leads to bonding pads formed on said semiconductor substrate, the bonding wires for connecting said signal leads of said inner leads to said bonding pads being substantially equal in length.

\* \* \* \* \*